(12) United States Patent
Cao et al.

(10) Patent No.: US 9,679,897 B1
(45) Date of Patent: Jun. 13, 2017

(54) HIGH DENSITY NANOFLUIDIC STRUCTURE WITH PRECISELY CONTROLLED NANO-CHANNEL DIMENSIONS

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/090,423

(22) Filed: Apr. 4, 2016

(51) Int. Cl.
*H01L 27/088* (2006.01)
*H01L 29/06* (2006.01)
(Continued)

(52) U.S. Cl.
CPC .... *H01L 27/0886* (2013.01); *B01L 3/502707* (2013.01); *B01L 3/502715* (2013.01); *H01L 21/02532* (2013.01); *H01L 21/30604* (2013.01); *H01L 21/31111* (2013.01); *H01L 21/56* (2013.01); *H01L 21/76224* (2013.01); *H01L 21/823431* (2013.01); *H01L 21/823481* (2013.01); *H01L 27/0203* (2013.01); *H01L 29/0649* (2013.01); *B01L 2200/10* (2013.01); *B01L 2200/12* (2013.01);
(Continued)

(58) Field of Classification Search
CPC ............. H01L 29/66795; H01L 29/785; H01L 29/66545; H01L 29/165
See application file for complete search history.

(56) References Cited

U.S. PATENT DOCUMENTS

| 8,569,867 B2 | 10/2013 | Inaba | 257/574 |
| 8,716,752 B2 | 5/2014 | Dove | 257/192 |

(Continued)

OTHER PUBLICATIONS

Virginia Semiconductor, Inc., Basic Crystallographic Definitions and Properties of Si, SiGe, and Ge, Jun. 2002.*
(Continued)

*Primary Examiner* — Marc Armand
*Assistant Examiner* — Shannon Yi
(74) *Attorney, Agent, or Firm* — Ido Tuchman; Jennifer R. Davis

(57) ABSTRACT

A nanofluidic structure including a semiconductor substrate and a dielectric layer positioned above and in contact with the semiconductor substrate. A first reservoir and a second reservoir are defined by the semiconductor substrate and the dielectric layer. The second reservoir is spaced apart from the first reservoir. Bottom passage fins protrude from the semiconductor substrate and extend from the first reservoir to the second reservoir. Top passage fins, above and spaced apart from the bottom passage fins, extend from the first reservoir to the second reservoir. Nanofluidic passages between the top and bottom fins connect the first reservoir and the second reservoir. Each of the nanofluidic passages includes a bottom wall, a top wall and sidewalls. The bottom wall is defined by a respective bottom passage fin. The top wall is defined by a respective top passage fin. The sidewalls are defined by the dielectric layer.

18 Claims, 16 Drawing Sheets

(51) Int. Cl.
*H01L 21/56* (2006.01)
*H01L 21/311* (2006.01)
*H01L 21/306* (2006.01)
*H01L 21/02* (2006.01)
*H01L 21/8234* (2006.01)
*H01L 21/762* (2006.01)
*H01L 27/02* (2006.01)
*B01L 3/00* (2006.01)

(52) U.S. Cl.
CPC . *B01L 2300/0645* (2013.01); *B01L 2300/087* (2013.01); *B01L 2300/0848* (2013.01); *B01L 2300/0851* (2013.01); *B01L 2300/0858* (2013.01); *B01L 2300/0887* (2013.01); *B01L 2300/0896* (2013.01); *B01L 2300/12* (2013.01)

(56) References Cited

U.S. PATENT DOCUMENTS

| | | | | |
|---|---|---|---|---|
| 8,728,844 B1 * | 5/2014 | Liu | ............... | H01L 29/66477 257/252 |
| 8,758,633 B1 | 6/2014 | Wang et al. | ............... | 216/2 |
| 9,029,132 B2 | 5/2015 | Khater et al. | ............... | 435/287.2 |
| 9,034,637 B2 | 5/2015 | Merz et al. | ............... | 435/287.2 |
| 2010/0015008 A1 * | 1/2010 | Ong | ............... | G01N 33/48728 422/82.01 |
| 2011/0233734 A1 * | 9/2011 | Wells | ............... | H01L 21/2015 257/618 |
| 2013/0244392 A1 * | 9/2013 | Oh | ............... | H01L 29/66477 438/299 |
| 2013/0291627 A1 | 11/2013 | Hu et al. | ............... | 73/61.61 |
| 2015/0054135 A1 | 2/2015 | Ho et al. | ............... | 257/618 |
| 2015/0219592 A1 | 8/2015 | Goluch et al. | ............... | 205/777.5 |
| 2016/0155739 A1 * | 6/2016 | Ting | ............... | H01L 29/0653 257/401 |
| 2016/0276484 A1 * | 9/2016 | Kim | ............... | H01L 29/7851 |

OTHER PUBLICATIONS

Duan et al., Review article: Fabrication of nanofluidic devices, Mar. 13, 2013, American Institute of Physics, Biomicrofluidics, pp. 026501-1 to 026501-32.*

P. Mao et al., "Fabrication and characterization of 20 nm planar nanofluidic channels by glass—glass and glass—silicon bonding," Lab on a Chip, vol. 5, No. 8, 2005, pp. 837-844.

C. Wang et al., "200 mm wafer-scale integration of sub-20 nm sacrificial nanofluidic channels for manipulating and imaging single DNA molecules," International Electron Device Meeting, 2013, pp. 369-372.

* cited by examiner

HIGH DENSITY NANOFLUIDIC STRUCTURE WITH PRECISELY CONTROLLED NANO-CHANNEL DIMENSIONS

BACKGROUND

The present invention is directed toward nanostructures, and, more particularly, toward fabrication of nanofluidic structures.

A nanofluidic structure is defined herein as a structure for the study, manipulation and control of fluids physically confined to passages between 1 to 100 nm along at least one dimension (e.g., length, width, and/or height). Fluids physically constrained to such size dimensions have been shown to exhibit new properties not observed in larger dimensions. Such properties include viscosity, thermodynamic and chemical reactivity properties. Thus, the ability to fabricate and utilize nanofluidic structures is important in investigating characteristics of fluids confided to nanometer dimensions.

A lab-on-a-chip (LOC) can help investigate nanofluidic characteristics. A LOC typically integrates fluid manipulation structures with laboratory circuitry fabricated on a chip. Typically, a LOC includes transistors to amplify electrical signals in a circuit. One type of transistor that helps reduce leakage current and overcome other short-channel effects is a Fin Field Effect Transistor (FinFET). A FinFET is a multiple gate field-effect transistor with conducting channels wrapped by a thin silicon "fin" at the transistor's gate.

BRIEF SUMMARY

One example aspect of the present invention is a nanofluidic structure. The nanofluidic structure includes a semiconductor substrate and a dielectric layer positioned above and in contact with the semiconductor substrate. A first reservoir and a second reservoir are defined by the semiconductor substrate and the dielectric layer. The second reservoir is spaced apart from the first reservoir. Bottom passage fins protrude from the semiconductor substrate and extend from the first reservoir to the second reservoir. Top passage fins, above and spaced apart from the bottom passage fins, extend from the first reservoir to the second reservoir. Nanofluidic passages between the top and bottom fins connect the first reservoir and the second reservoir. Each of the nanofluidic passages includes a bottom wall, a top wall and sidewalls. The bottom wall is defined by a respective bottom passage fin. The top wall is defined by a respective top passage fin. The sidewalls are defined by the dielectric layer.

Another example aspect of the present invention is a method for constructing a nanofluidic structure. The method includes receiving a wafer having a semiconductor substrate. The wafer including a first set of vertical passage fins extending from the semiconductor substrate. Each of the vertical passage fins includes a bottom passage silicon fin in contact with the semiconductor substrate, a top passage silicon fin above and spaced apart from the bottom passage silicon fin, and a silicon-germanium passage fin positioned between and in contact with the bottom passage silicon fin and the top passage silicon fin. The silicon-germanium passage fin has the same crystal orientation as the bottom passage silicon fin. The method further includes encapsulating the vertical passage fins with an encapsulation layer. An etching operation etches the encapsulation layer and the semiconductor substrate to form a first reservoir proximate first ends of the vertical passage fins and a second reservoir proximate second ends of the vertical passage fins such that the first ends and the second ends of the vertical passage fins are exposed. Another etching operation etches the silicon-germanium passage fins to form nanofluidic passages between the first reservoir and the second reservoir.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1A through 15. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Aspects of the present invention include nanofluidic channels with silicon top and bottom walls and silicon oxide sidewalls. A nanofluidic channel is defined herein as a channel having a width and/or height between 1 to 100 nm. Other aspects of the present invention include a nanofluidic fabrication process that requires a single epitaxy process to grow SiGe and Si on a Si substrate, then pattern both epitaxy SiGe and Si into fins, fill gaps between fins with shallow trench isolation (STI) oxide, and remove the SiGe to form nanofluidic channels.

Figure 1A:
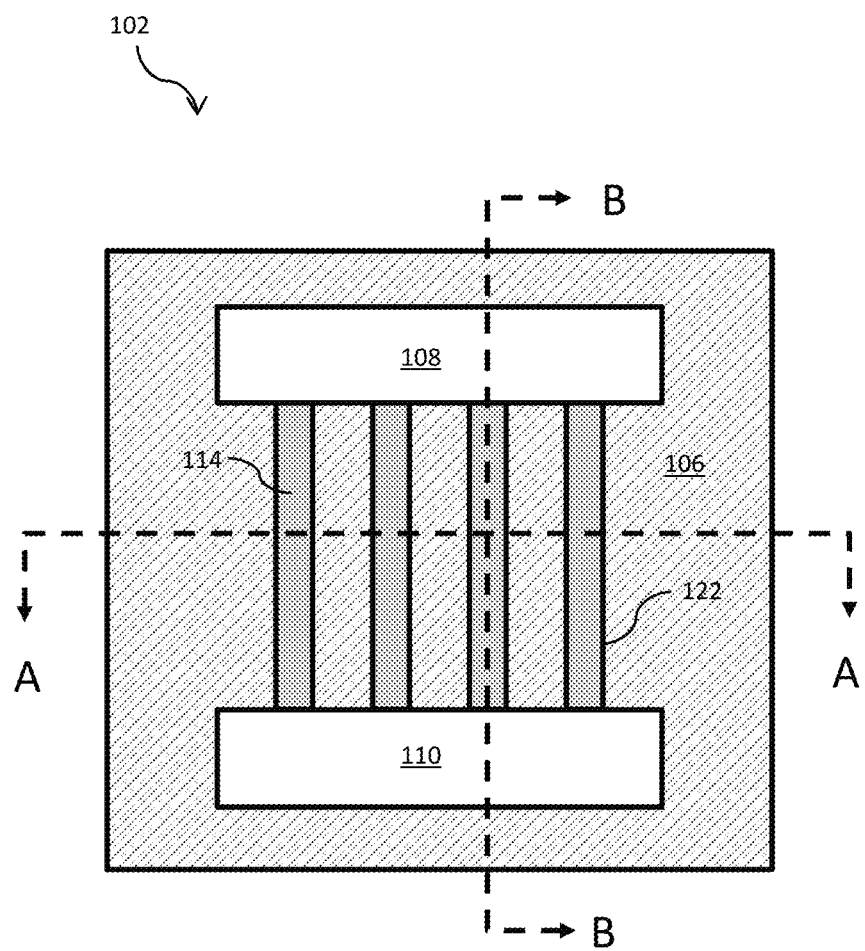
FIGS. 1A-1C show an example nanofluidic structure contemplated by the present invention.
Figure 1B:
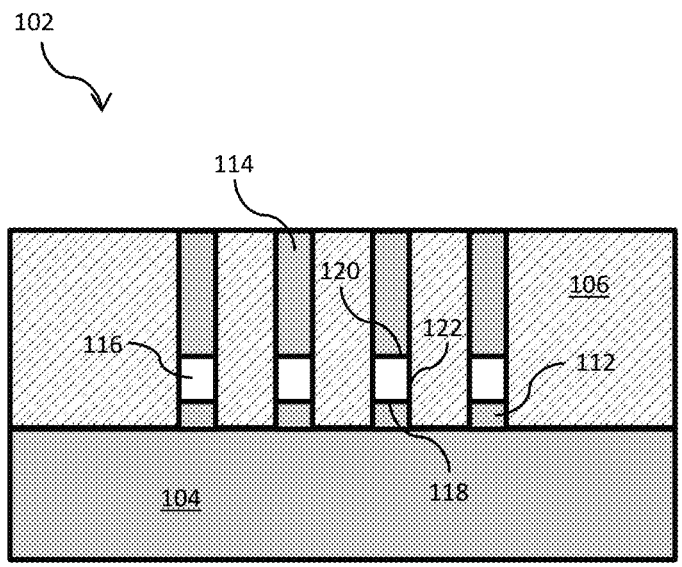
Figure 1C:
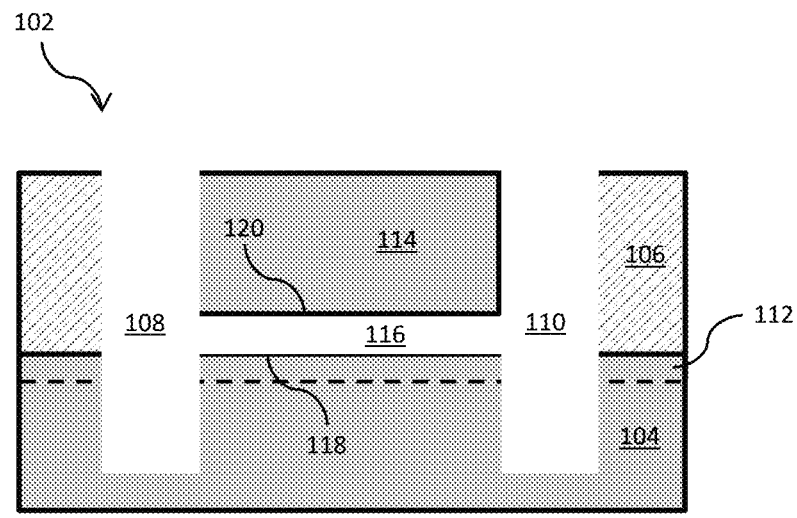

FIGS. 1A-1C show an example nanofluidic structure 102 contemplated by the present invention. FIG. 1B shows the nanofluidic structure 102 along cross-section line A-A of FIG. 1A. FIG. 1C shows the nanofluidic structure 102 along cross-section line B-B of FIG. 1A.

The nanofluidic structure 102 includes a semiconductor substrate 104 and a dielectric layer 106 positioned above and in contact with the semiconductor substrate 104. A first reservoir 108 is defined by the semiconductor substrate 104 and the dielectric layer 106. A second reservoir 110 is also defined by the semiconductor substrate 104 and the dielectric layer 106. The second reservoir 110 is spaced apart from the first reservoir 108.

A plurality of silicon bottom passage fins 112 protrude from the semiconductor substrate 104. The bottom passage fins 112 extend from the first reservoir 108 to the second reservoir 110.

A plurality of silicon top passage fins 114 are positioned above, and spaced apart from, the bottom passage fins 112. The top passage fins 114 extend from the first reservoir 108 to the second reservoir 110. In one embodiment, the top passage fins include a silicon layer and a hardmask layer positioned over and in contact with the silicon layer (see FIG. 13).

A plurality of first nanofluidic passages 116 connect the first reservoir 108 and the second reservoir 110. Each of the first nanofluidic passages 116 includes a bottom wall 118, a top wall 120 and sidewalls 122. The bottom wall 118 is defined by the bottom passage fins 112. The top wall 120 is defined by the top passage fins 114. The sidewalls 122 are defined by the dielectric layer 106.

Figure 2A:
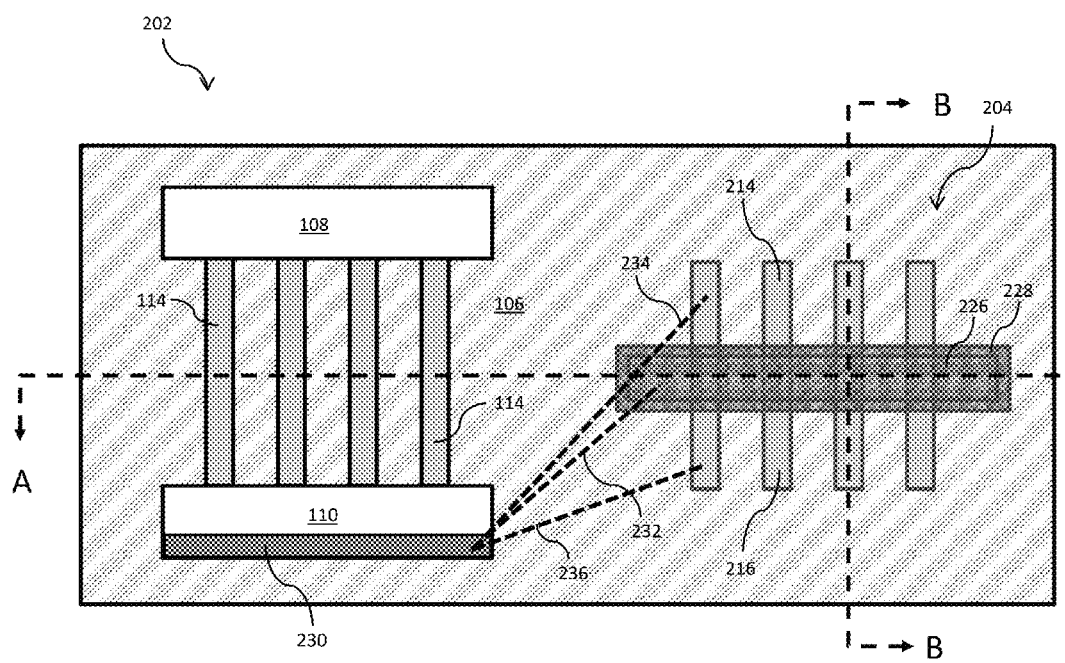
FIGS. 2A-2C show an example of another nanofluidic structure contemplated by the present invention.
Figure 2B:
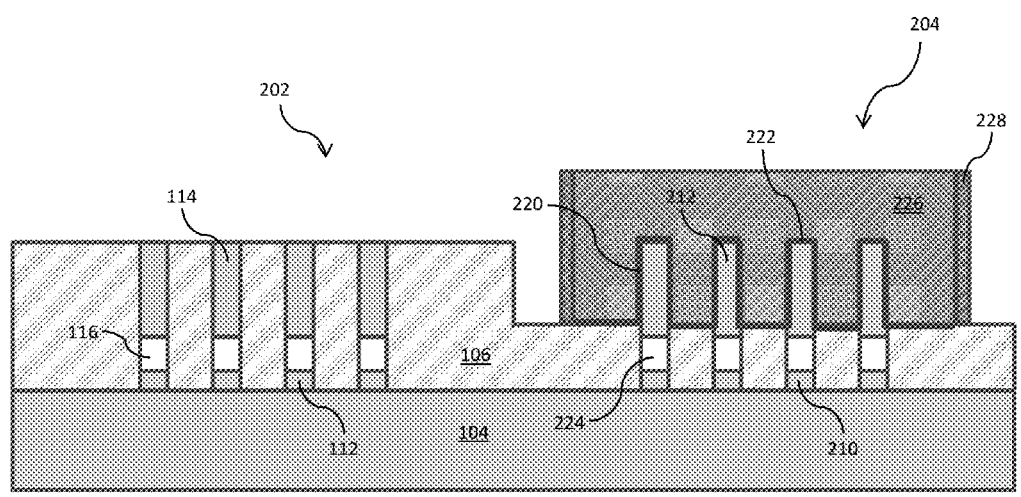
Figure 2C:
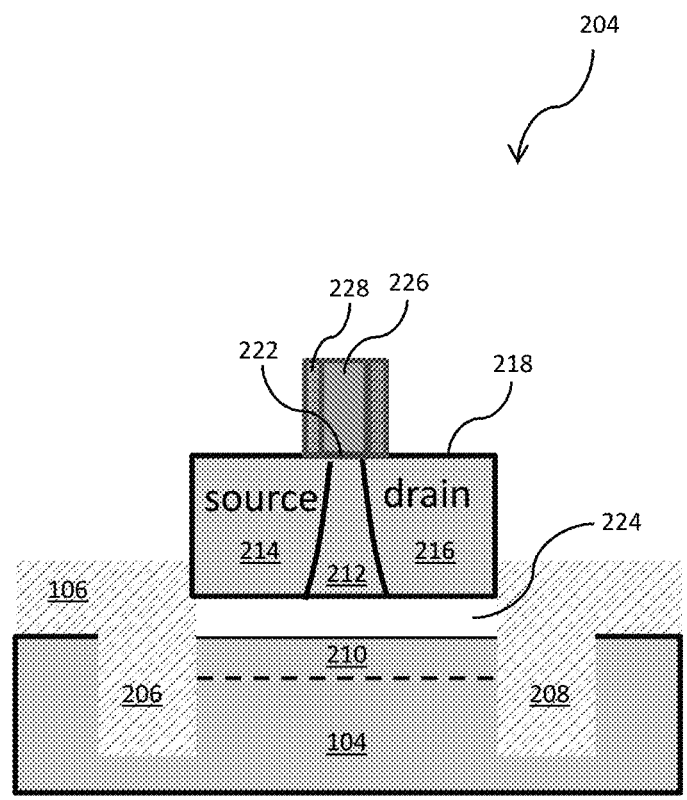

FIGS. 2A-2C show an example of another nanofluidic structure 202 contemplated by the present invention. FIG. 2B shows the nanofluidic structure 202 along cross-section line A-A of FIG. 2A. FIG. 2C shows the nanofluidic structure 202 along cross-section line B-B of FIG. 2A.

The nanofluidic structure 202 includes a semiconductor substrate 104 and a dielectric layer 106 positioned above and in contact with the semiconductor substrate 104, as discussed above. The nanofluidic structure 202 further includes a plurality of silicon bottom passage fins 112 protruding from the semiconductor substrate 104, a plurality of silicon top passage fins 114 positioned above and spaced apart from the bottom passage fins 112, and a plurality of first nanofluidic passages 116 connecting the first reservoir 108 and the second reservoir 110, as discussed above.

The nanofluidic structure 202 additionally contains an integrated multigate field effect transistor (FET) 204. The FET 204 includes a first STI 206 defined by the semiconductor substrate and filled by the dielectric layer 106. A second STI 208 is defined by the semiconductor substrate and filled by the dielectric layer 106. Thus, the first STI 206 and the second STI are filled by a dielectric material. The first STI 206 is spaced apart from the second STI 208.

The FET 204 includes a plurality of silicon bottom FET fins 210 protruding from the semiconductor substrate 104 that extend from the first STI 206 to the second STI 208. A plurality of silicon top FET fins 212 are positioned above and spaced apart from the bottom FET fins 210. The top FET fins 212 also extend from the first STI 206 to the second STI 208.

The FET 204 further includes second nanofluidic passages 224 extending from the first STI to the second STI. Each of the second nanofluidic passages includes a bottom wall, a top wall and sidewalls, the bottom wall defined by a respective one of the bottom FET fins 210, the top wall defined by a respective one of the top FET fins 212, and the sidewalls defined by the dielectric layer 106. Each of the top FET fins 212 includes doped source regions 214 at a first end and doped drain regions 216 at an opposite second end. Each of the top FET fins 212 also includes a top surface 218 and side surfaces 220.

A gate dielectric 222 is disposed over and in contact with the top surface and the side surfaces of the top FET fins. The gate dielectric 222 is positioned between the doped source regions 214 and the doped drain regions 216. A gate conductor 226 is disposed over and in contact with the gate dielectric 222. The FET 204 further includes a dielectric spacer 228 in contact with side surfaces of the gate conductor.

The nanofluidic structure 202 may include an electrode 230 positioned in the second reservoir 110 and electrically coupled 232 to the gate conductor 226. In another embodiment, the electrode 230 is electrically coupled 234 to the doped drain regions 216. Alternatively, the electrode 230 is electrically coupled 236 to the doped drain regions 214. Those skilled in the art will understand that electrical connections between the electrode 230 and the FET 204 may be fabricated using metal layers, such as Metal 1 and Metal 2 layers, as well as metal vias and other conductive materials known in the art.

Figure 3A:
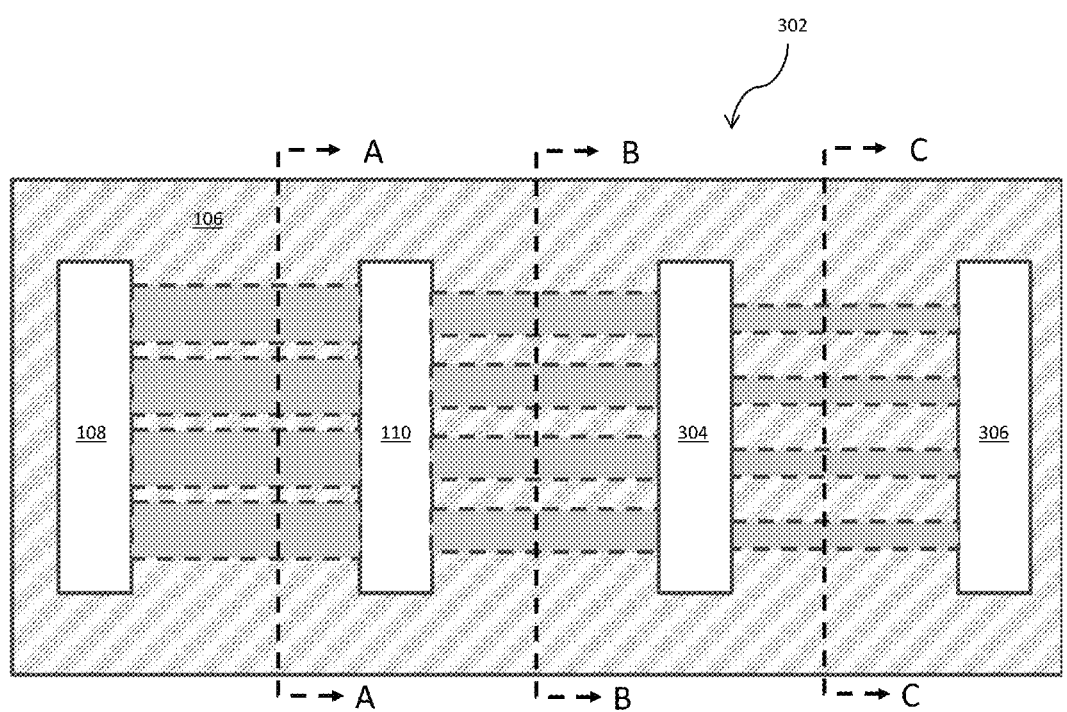
FIGS. 3A-3D show an example of another nanofluidic structure contemplated by the present invention.
Figure 3B:
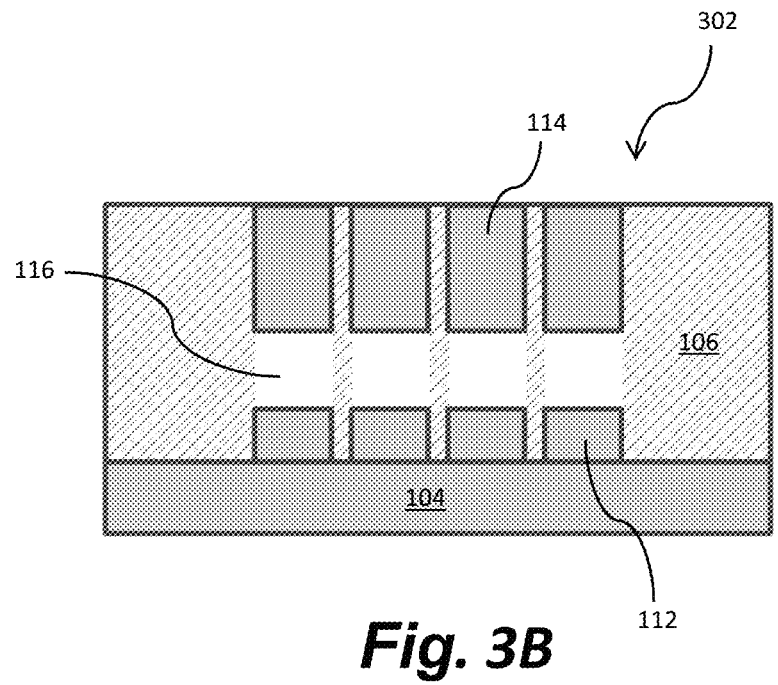
Figure 3C:
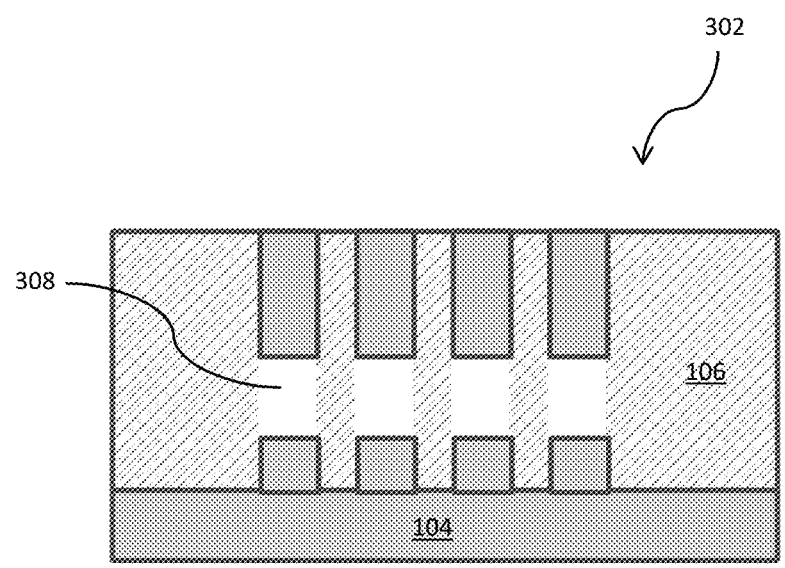
Figure 3D:
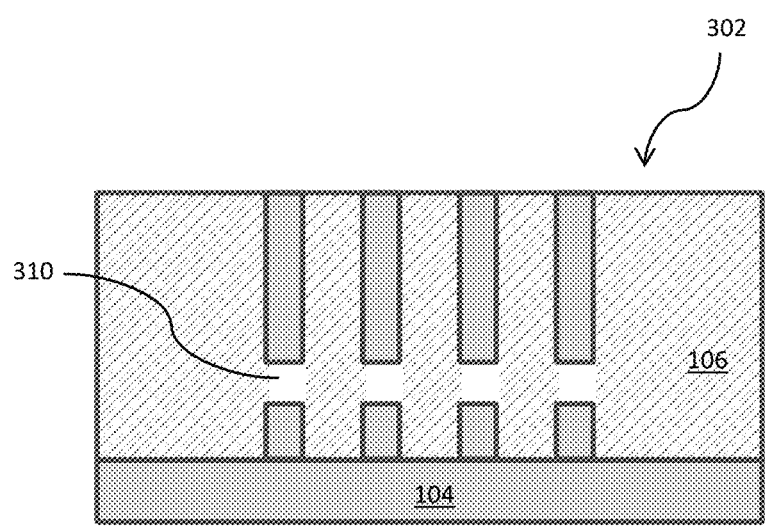

FIGS. 3A-3D show an example of another nanofluidic structure 302 contemplated by the present invention. FIG. 3B shows the nanofluidic structure 302 along cross-section line A-A of FIG. 3A. FIG. 3C shows the nanofluidic structure 302 along cross-section line B-B of FIG. 3A. FIG. 3D shows the nanofluidic structure 302 along cross-section line C-C of FIG. 3A.

The nanofluidic structure 302 includes a semiconductor substrate 104 and a dielectric layer 106 positioned above and in contact with the semiconductor substrate 104, as discussed above. The nanofluidic structure 302 further includes a plurality of silicon bottom passage fins 112 protruding from the semiconductor substrate 104, a plurality of silicon top passage fins 114 positioned above and spaced apart from the bottom passage fins 112, and a plurality of first nanofluidic passages 116 connecting the first reservoir 108 and the second reservoir 110, as discussed above.

The nanofluidic structure 302 includes a third reservoir 304 and a fourth reservoir 306. The third reservoir 304 is defined by the semiconductor substrate 104 and the dielectric layer 106. Furthermore, the third reservoir 304 is spaced apart from the first reservoir 108, the second reservoir 110 and the fourth reservoir 306. Second nanofluidic passages 308 connect the second reservoir 110 and the third reservoir 306. Each of the second nanofluidic passages 308 has a smaller cross-sectional area than each of the first nanofluidic passages 116. Third nanofluidic passages 310 connect the third reservoir 304 and the forth reservoir 306. Each of the third nanofluidic passages 310 has a smaller cross-sectional area than each of the second nanofluidic passages 308.

In one embodiment, the sidewalls of each of the second nanofluidic passages 308 are positioned closer to each other than the sidewalls of each of the first nanofluidic passages 116. In addition, or alternatively, the bottom and top walls of each of the second nanofluidic passages 308 are positioned closer to each other than the bottom wall and the top wall of each of the first nanofluidic passages 116. Similarly, the walls of each of the third nanofluidic passages 310 are positioned closer to each other than the sidewalls of each of the second nanofluidic passages 308.

In this manner, mix of materials and/or biological species with different sizes can flow from the first reservoir 108 to the fourth reservoir 306. Materials in the first reservoir 108 that cannot fit through the first nanofluidic passages 116 will remain trapped in the first reservoir 108. Materials in the second reservoir 110 that cannot pass through the second nanofluidic passages 308 will remain trapped in the second reservoir 108. Materials in the third reservoir 304 that cannot pass through the third nanofluidic passages 310 will remain trapped in the third reservoir 304. The material that can pass through the third nanofluidic passages 310 will arrive in the fourth reservoir 306.

Figure 4:
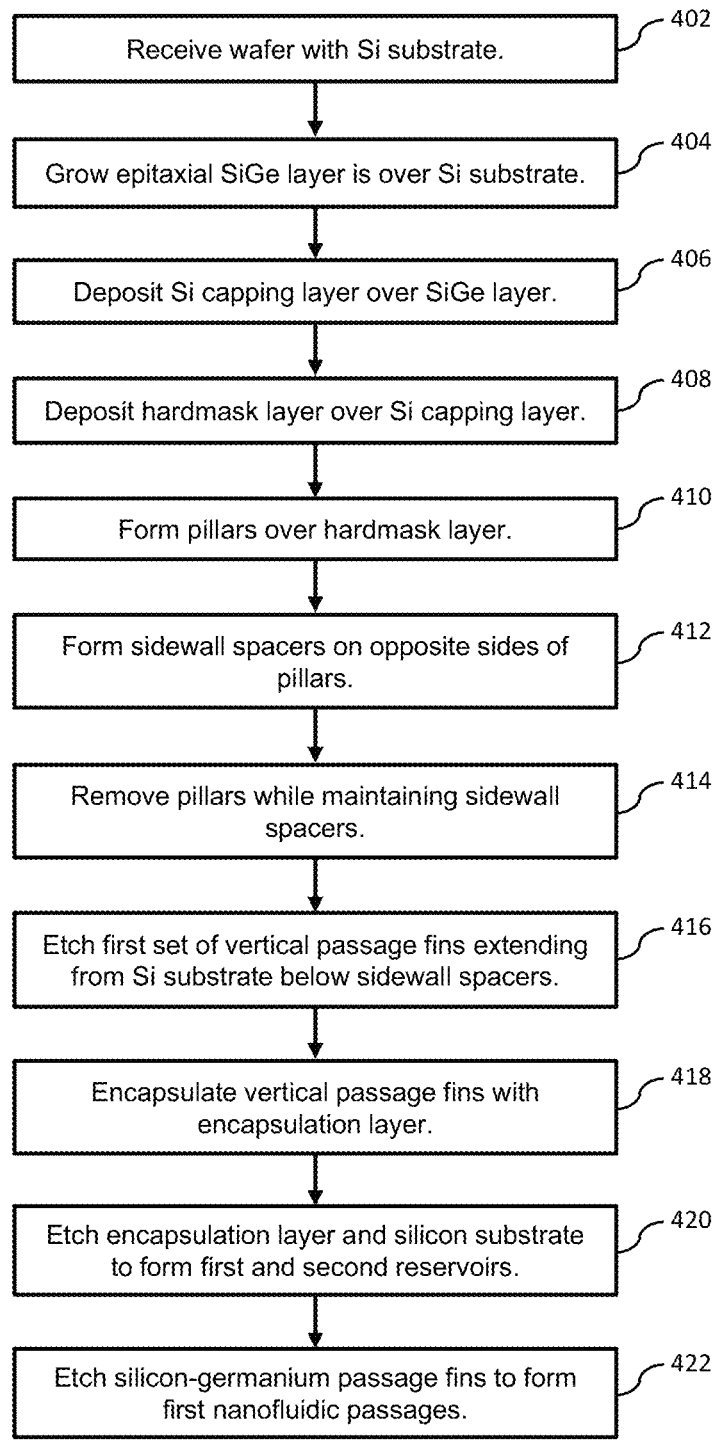
FIG. 4 shows an example method for constructing a nanofluidic structure contemplated by the present invention.

FIG. 4 shows an example method for constructing a nanofluidic structure contemplated by the present invention. The method includes a receiving step 402, which receives a wafer having a semiconductor substrate. In one embodiment, the semiconductor substrate comprises a silicon wafer. Next, at growing step 404, an epitaxial silicon-germanium layer is grown over the semiconductor substrate such that the silicon-germanium layer has the same crystal orientation as the semiconductor substrate. At depositing operation 406, a silicon capping layer is deposited over the epitaxial silicon-germanium layer.

Figure 5:
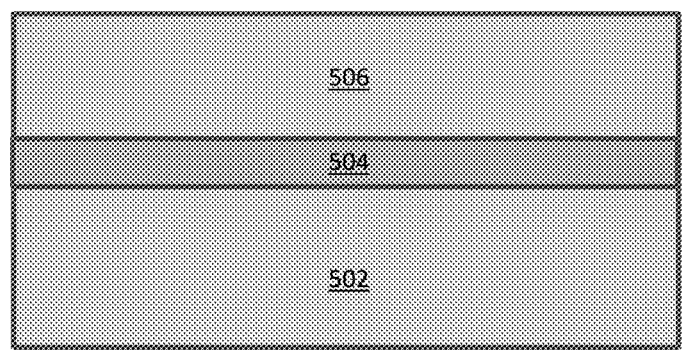
FIG. 5 shows a nanofluidic structure fabrication process after deposition operation 406 of FIG. 4.

FIG. 5 shows a nanofluidic structure fabrication process after deposition operation 406. The structure includes the semiconductor substrate 502, the epitaxial silicon-germanium layer 504 grown over the semiconductor substrate 502, and the silicon capping layer 506 deposited over the epitaxial silicon-germanium layer 504. The semiconductor substrate 502 may comprise any suitable semiconductor material such as silicon, germanium, silicon carbide, carbon doped silicon, compound semiconductor such as III-V and II-V compound semiconductor, or any suitable combination of those materials. The semiconductor substrate 502 may further comprise other device structures such as isolation, wires, etc. It is contemplated that the semiconductor substrate 502 may be, for example, a portion of a bulk silicon wafer or a silicon on insulator (SOI) wafer.

Returning to FIG. 4, at depositing step 408, a hardmask layer is deposited over the silicon capping layer. In one embodiment, the hardmask layer is silicon nitride. After depositing step 408 is completed, process flow proceeds to forming step 410.

Figure 6:
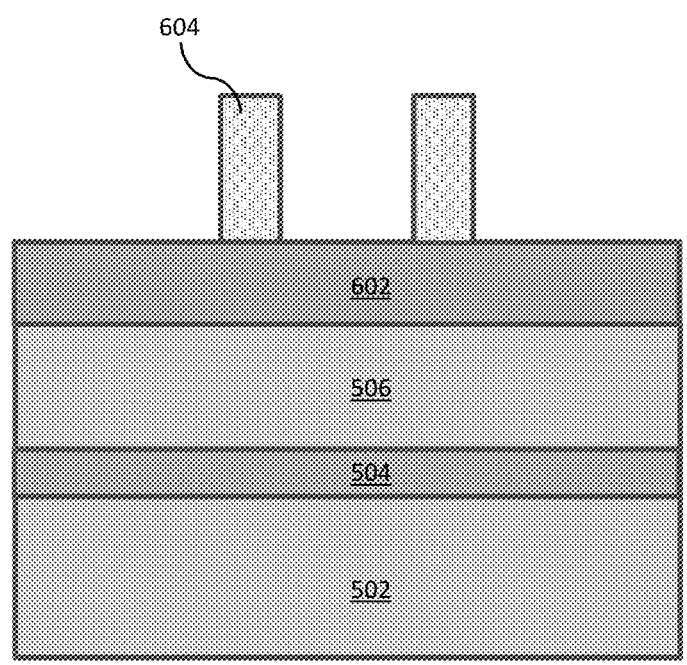
FIG. 6 shows depositing a mandrel layer over a hardmask layer.

At forming step 410, one or more pillars are formed over the hardmask layer by using any suitable patterning technique. With reference to FIG. 6, forming step 410 may include depositing a mandrel layer, such as amorphous carbon, over the hardmask layer 602. The mandrel layer 602 is then patterned using lithography and directional etch, such as a reactive ion etch (RIE), to form the pillars 604. In one embodiment, the pillars are composed of amorphous carbon. Returning to FIG. 4, after forming step 410 is completed, process flow proceeds to forming step 412.

Figure 7:
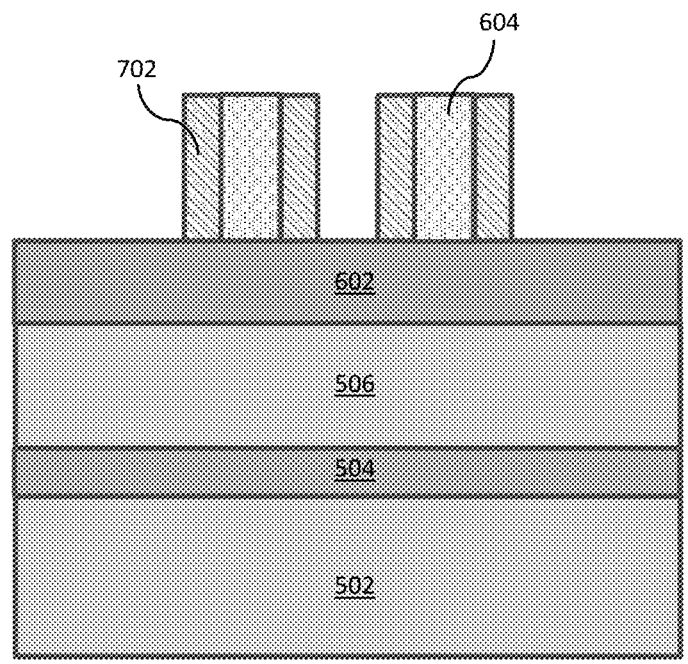
FIG. 7 shows sidewall spacers formed on opposite sides of the pillars.

At forming step 412, sidewall spacers are formed on opposite sides of the pillars. With reference to FIG. 7, the sidewall spacers 702 may be composed of silicon oxide and formed on opposite sides of the pillars 604 by silicon oxide deposition and RIE. Returning to FIG. 4, after forming step 412 is completed, process flow proceeds to removing step 414.

Figure 8:
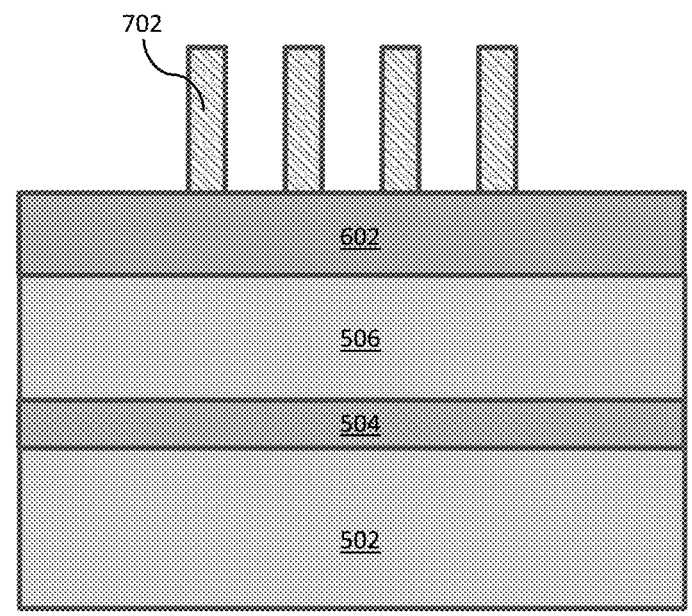
FIG. 8 shows the fabrication structure after removal of the pillars.

At removing step 414, the pillars while maintaining the sidewall spacers. FIG. 8 shows the fabrication structure after removal of the pillars. In one embodiment, the amorphous carbon pillars are stripped by asking. Returning to FIG. 4, after removing step 414 is completed, process flow proceeds to etching step 416.

Figure 9:
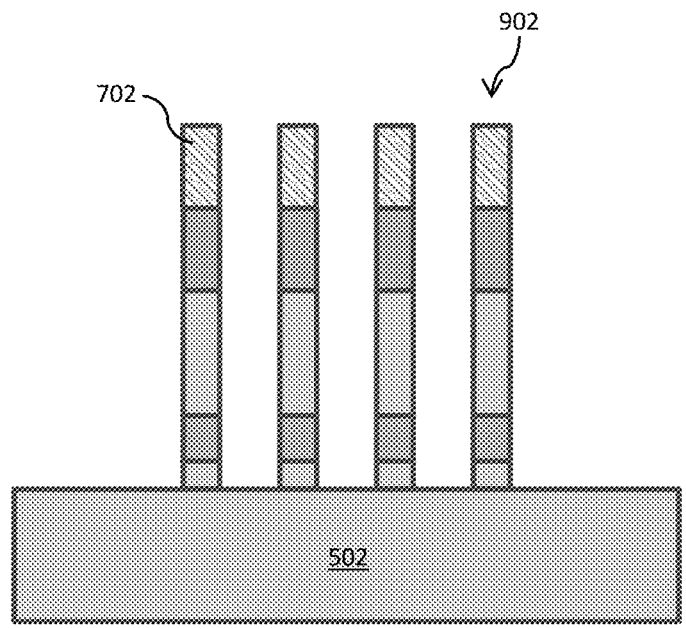
FIG. 9 shows the first set of vertical passage fins 902 extending from the semiconductor substrate below the sidewall spacers.
Figure 10:
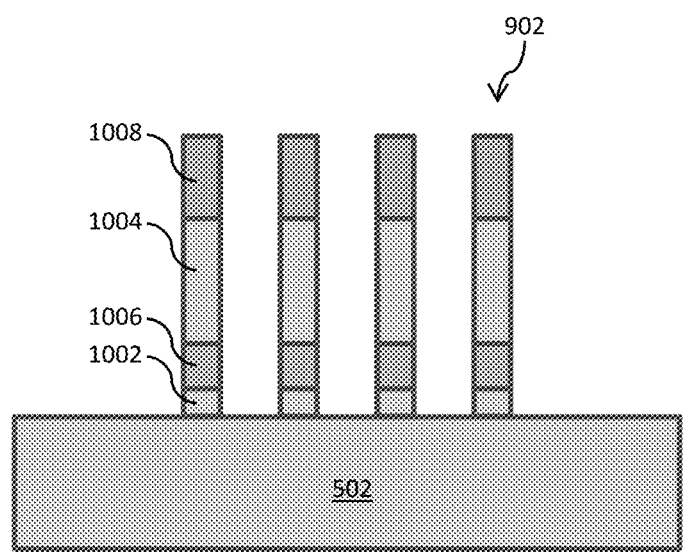
FIG. 10 shows the sidewall spacers removed from the first set of vertical passage fins.

At etching step 416, a first set of vertical passage fins are etched using the sidewall spacers as a mask. FIG. 9 shows the first set of vertical passage fins 902 extending from the semiconductor substrate below the sidewall spacers. As shown in FIG. 10, the sidewall spacers 702 are removed from the first set of vertical passage fins 902. In one embodiment, the sidewall spacers 702 are etched by an aqueous solution containing hydrofluoric acid. Accordingly, each of the vertical passage fins 902 includes a bottom passage silicon fin 1002 in contact with the semiconductor substrate 502, a top passage silicon fin 1004 above and spaced apart from the bottom passage silicon fin 1002, a silicon-germanium passage fin 1006 positioned between and in contact with the bottom passage silicon fin 1002 and the top passage silicon fin 1004, and a hardmask fin 1008 over the top passage silicon fin 1004. Since the silicon-germanium passage fin 1006 is epitaxially grown, it has the same crystal orientation as the bottom passage silicon fin 1002. Returning to FIG. 4, after etching step 416 is completed, process flow proceeds to encapsulating step 418.

Figure 11:
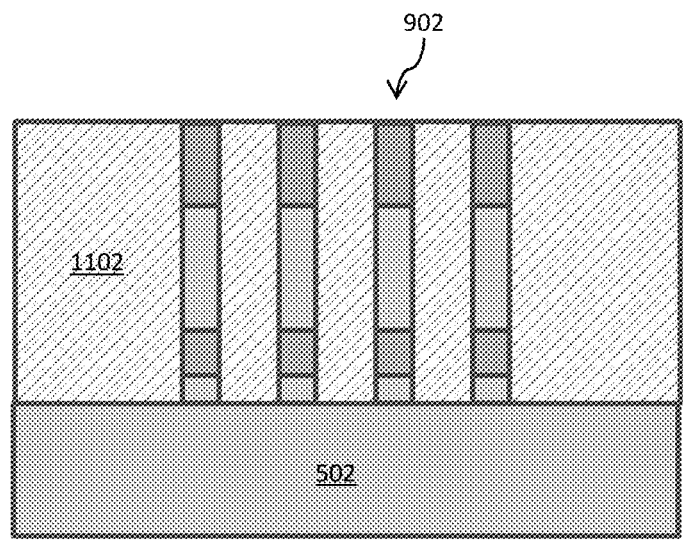
FIG. 11 shows the vertical passage fins encapsulated with an encapsulation layer.

At encapsulating step 418, the vertical passage fins are encapsulated with an encapsulation layer. FIG. 11 shows the vertical passage fins 902 encapsulated with an encapsulation layer 1102. It is noted that trenches between the vertical passage fins 902 are fill with the encapsulation layer 1102. In one embodiment, the encapsulation layer 1102 is a dielectric material, such as silicon oxide. The encapsulating step 418 may include a planarization step, wherein the vertical passage fins 902 and the encapsulation layer 1102 are planarized using, for example, a chemical-mechanical polish (CMP). The trenches filled with the encapsulation layer 1102 may be referred to herein as shallow trench isolation (STI). Returning to FIG. 4, after encapsulating step 418 is completed, process flow proceeds to etching step 420.

At etching step 420, the encapsulation layer and the semiconductor substrate are etched to form a first reservoir and a second reservoir. The first reservoir is positioned proximate first ends of the vertical passage fins. The second reservoir is positioned proximate second ends of the vertical passage fins. The etching step 420 exposes the first ends and the second ends of the vertical passage fins.

Figure 12A:
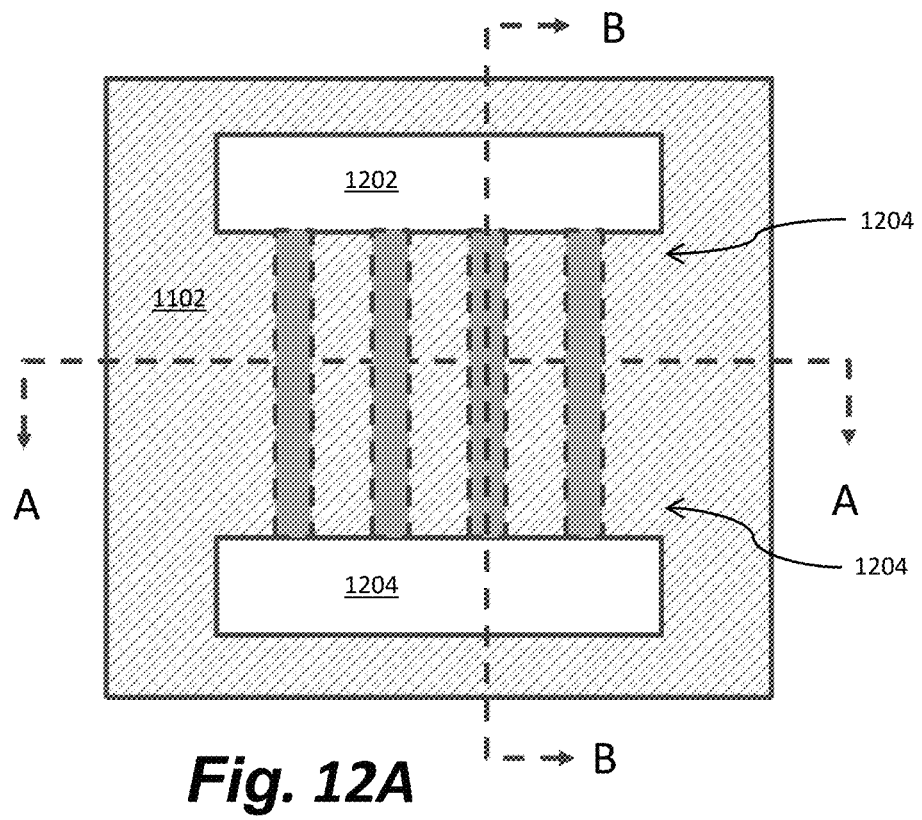
FIGS. 12A-12C show the nanofluidic structure after etching step 420 of FIG. 4 has been performed.
Figure 12B:
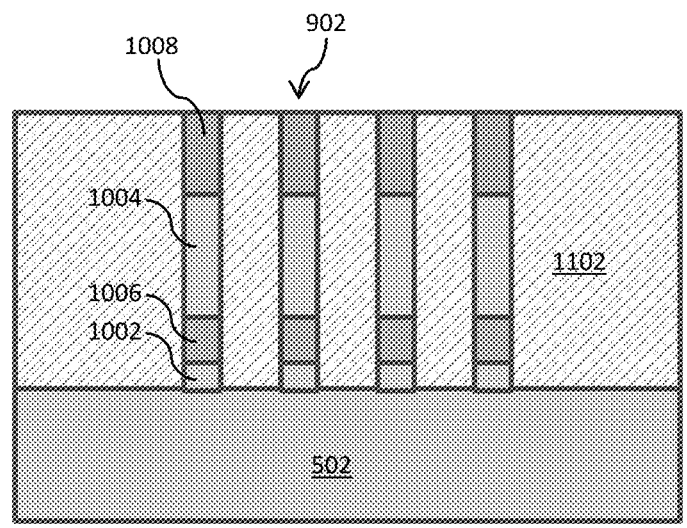
Figure 12C:
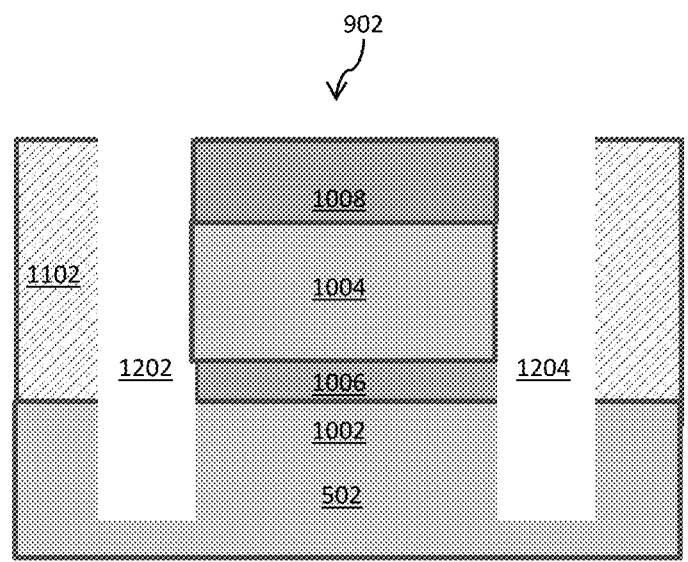

FIGS. 12A-12C show the nanofluidic structure 102 after etching step 420 has been performed. FIG. 12B shows the nanofluidic structure 102 along cross-section line A-A of FIG. 12A. FIG. 12C shows the nanofluidic structure 102 along cross-section line B-B of FIG. 12A. The formation of the first reservoir 1202 and the second reservoir 1204 is performed by first using a mask to open the reservoir areas and cover the rest of the areas. Next, RIE is used to etch through the hardmask 1008, STI 1102, Si 1004, SiGe 1006 and into the Si substrate 502. The mask (e.g., photoresist) can be stripped after the RIE. Returning to FIG. 4, after etching step 420 is completed, process flow proceeds to etching step 422.

Figure 13:
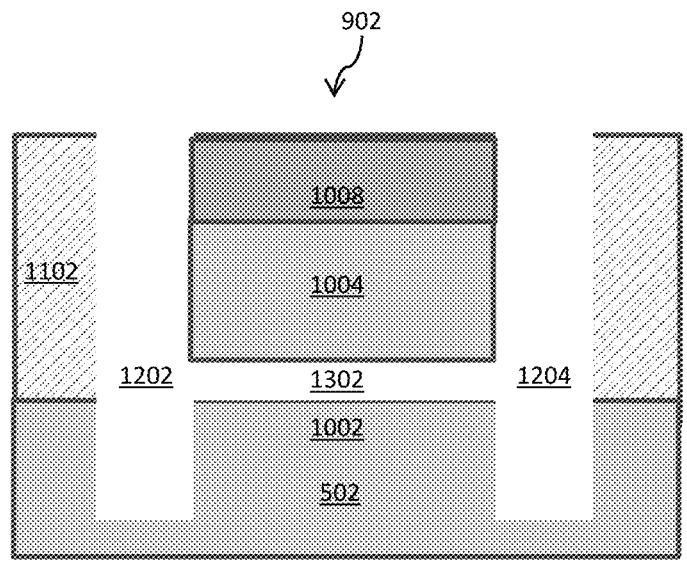
FIG. 13 shows first nanofluidic passages formed between the first reservoir and the second reservoir.

At etching step 422, the silicon-germanium passage fins are etched to form first nanofluidic passages between the first reservoir and the second reservoir. The first reservoir is positioned proximate first ends of the vertical passage fins. FIG. 13 shows first nanofluidic passages 1302 formed between the first reservoir 1202 and the second reservoir 1204. The silicon-germanium passage fin 1006 can be etched selective to all other materials using, for example, hydrofluoric gas at 600° C. Returning to FIG. 4, after etching step 422 is completed, process flow proceeds to recessing step 424.

At recessing step 424, the hardmask fin 1008 and the encapsulation layer 1102 are planarized using, for example, CMP (see FIGS. 1A-1C). After recessing step 424, the nanofluidic structure is complete.

Figure 14:
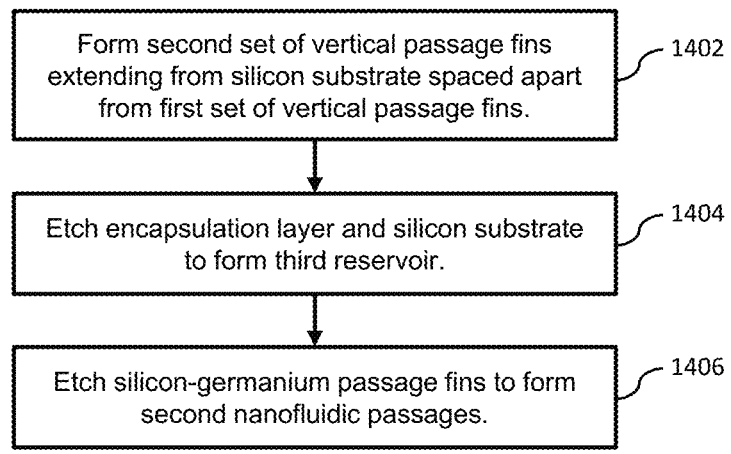
FIG. 14 shows additional steps to FIG. 4 for fabricating a nanofluidic structure with multiple reservoirs connected with progressively smaller nanofluidic passages.

FIG. 14 shows additional steps to FIG. 4 for fabricating a nanofluidic structure with multiple reservoirs connected with progressively smaller nanofluidic passages (see FIGS. 3A-3D). The process includes forming step 1402, which forms a second set of vertical passage fins extending from the semiconductor substrate spaced apart from the first set of vertical passage fins. Each of the vertical passage fins of the second set of vertical passage fins includes a bottom silicon passage fin in contact with the semiconductor substrate, a top silicon passage fin above and spaced apart from the bottom silicon passage fin, and a silicon-germanium passage fin positioned between and in contact with the bottom silicon passage fin and the top silicon passage fin. These substructures may be fabricated according to steps 408 through 418 of FIG. 4. Thus, the silicon-germanium passage fin has the same crystal orientation as the bottom silicon passage fin. After forming step 1402 is completed, process flow proceeds to etching step 1404.

At etching step 1404, the encapsulation layer and the semiconductor substrate are etched to form a third reservoir proximate first ends of the vertical passage fins of the second set of vertical passage fins. This process step is similar to etching step 420 of FIG. 4. The second reservoir is proximate second ends of the vertical passage fins of the second set of vertical passage fins, and the first ends and the second ends of the vertical passage fins of the second set of vertical passage fins are exposed. After etching step 1404 is completed, process flow proceeds to etching step 1406.

At etching step 1406, the silicon-germanium passage fins of the second set of vertical passage fins are etched to form second nanofluidic passages between the second reservoir and the third reservoir. This process step is similar to etching step 422 of FIG. 4. Each of the second nanofluidic passages has a smaller cross-sectional area than each of the first nanofluidic passages. In one embodiment, the sidewalls of each of the second nanofluidic passages are positioned closer to each other than sidewalls of each of the first nanofluidic passages. In another embodiment, bottom and top walls of each of the second nanofluidic passages are positioned closer to each other than the bottom and top walls of each of the first nanofluidic passages.

Figure 15:
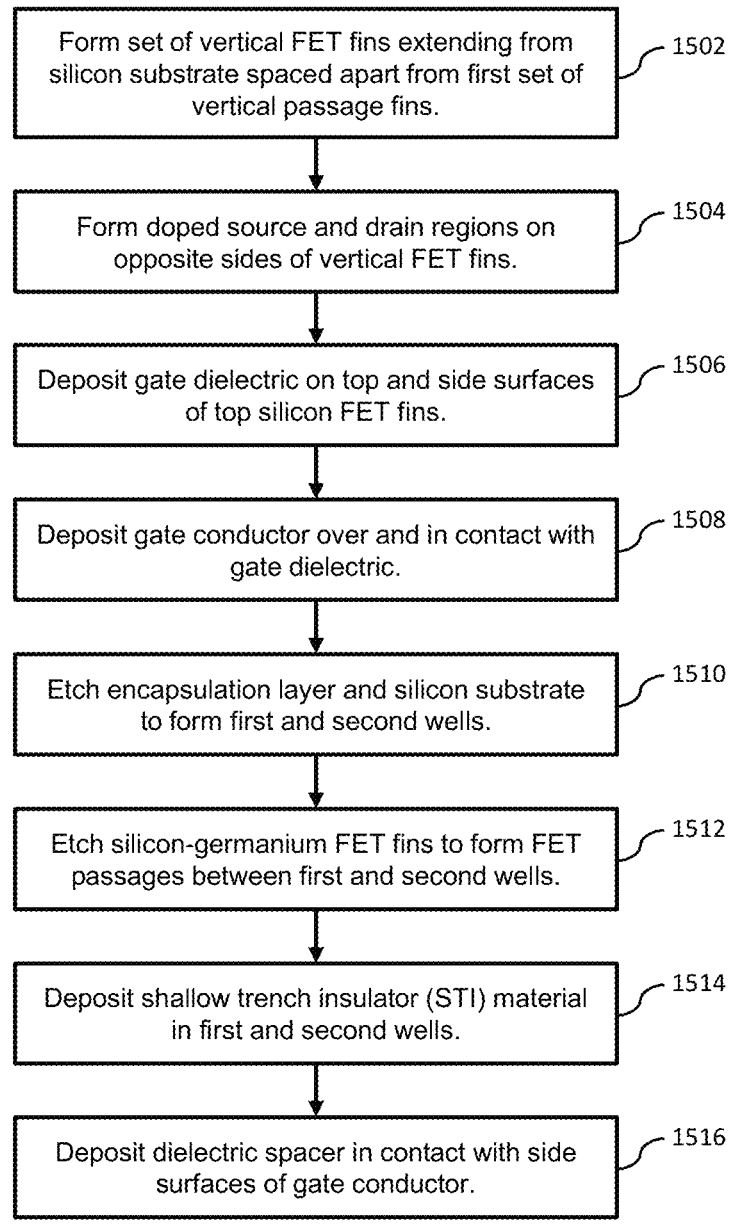
FIG. 15 shows additional method steps to FIG. 4 for fabricating a nanofluidic structure with an integrated multi-fin transistor.

FIG. 15 shows additional method steps to FIG. 4 for fabricating a nanofluidic structure with an integrated multi-fin transistor (see FIGS. 2A-2C). The process includes forming step 1502, which forms a set of vertical FET fins extending from the semiconductor substrate spaced apart from the first set of vertical passage fins. Each of the vertical FET fins includes a bottom silicon FET fin in contact with the semiconductor substrate, a top silicon FET fin above and spaced apart from the bottom silicon FET fin, and a silicon-germanium FET fin positioned between and in contact with the bottom silicon FET fin and the top silicon FET fin. The bottom silicon FET fins extend from the STI material in the first well to the STI material in the second well. These sub-structures may be fabricated according to steps 408 through 418 of FIG. 4. Thus, the silicon-germanium FET fin has the same crystal orientation as the bottom silicon FET fin. After forming step 1502 is completed, process flow proceeds to forming step 1504.

At forming step 1504, doped source and drain regions are formed on opposite sides of the vertical FET fins. In one embodiment, the doped source and drain regions are N-doped by introducing, for example, phosphorus and/or arsenic impurities to the vertical FET fins. In another embodiment, the doped source and drain regions are P-doped by introducing, for example, boron, gallium, and/or indium impurities to the vertical FET fins. After forming step 1504 is completed, process flow proceeds to depositing step 1506.

At depositing step 1506, a gate dielectric is deposited over and in contact with a top surface and the side surfaces of the top silicon FET fins. The gate dielectric is positioned between the doped source regions and the doped drain regions. After depositing step 1506 is completed, process flow proceeds to depositing step 1508.

At depositing step 1508, a gate conductor is deposited over and in contact with the gate dielectric. The gate conductor may be composed, for example, of metals, conducting metallic compounds, doped semiconductor, or any suitable combination of those materials. After depositing step 1508 is completed, process flow proceeds to etching step 1510.

At etching step 1510, the encapsulation layer and the semiconductor substrate are etched to form first and second wells at opposite ends of the vertical FET fins. After depositing step 1508 is completed, process flow proceeds to etching step 1510. After etching step 1510 is completed, process flow proceeds to etching step 1512.

At etching step 1512, the silicon-germanium FET fins are etched between the first well and the second well. This process step is similar to etching step 422 of FIG. 4. After etching step 1512 is completed, process flow proceeds to depositing step 1514.

At depositing step 1514, a shallow trench insulator (STI) material is deposited in the first well and the second well. Next, at depositing step 1516, a dielectric spacer is deposited in contact with side surfaces of the gate conductor to complete the FinFET structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A nanofluidic structure comprising:
a semiconductor substrate;
a dielectric layer positioned above and in contact with the semiconductor substrate;
a first reservoir defined by the semiconductor substrate and the dielectric layer;
a second reservoir defined by the semiconductor substrate and the dielectric layer, the second reservoir spaced apart from the first reservoir;
a plurality of bottom passage fins protruding from the semiconductor substrate, the bottom passage fins extending from the first reservoir to the second reservoir;
a plurality of top passage fins above and spaced apart from the bottom passage fins, the top passage fins extending from the first reservoir to the second reservoir, the top passage fins include a silicon layer and a hardmask layer positioned over and in contact with the silicon layer; and first nanofluidic passages connecting the first reservoir and the second reservoir, each of the first nanofluidic passages includes a bottom wall, a top wall and sidewalls, the bottom wall defined by a respective one of the bottom passage fins, the top wall defined by a respective one of the top passage fins, and the sidewalls defined by the dielectric layer.

2. The nanofluidic structure of claim 1, further comprising:

a third reservoir defined by the semiconductor substrate and the dielectric layer, the third reservoir spaced apart from the first reservoir and the second reservoir; and second nanofluidic passages connecting the second reservoir and the third reservoir, each of the second nanofluidic passages has a smaller cross-sectional area than each of the first nanofluidic passages.

3. The nanofluidic structure of claim 1, further comprising:

a plurality of bottom FET fins protruding from the semiconductor substrate;

a plurality of top FET fins above and spaced apart from the bottom FET fins, each of the top FET fins including a top surface and side surfaces;

doped source regions at the top FET fins;

doped drain regions at the top FET fins;

a gate dielectric disposed over and in contact with the top surface and the side surfaces of the top FET fins, the gate dielectric positioned between the doped source regions and the doped drain regions; and a gate conductor disposed over and in contact with the gate dielectric.

4. The nanofluidic structure of claim 2, wherein the sidewalls of each of the second nanofluidic passages are positioned closer to each other than the sidewalls of each of the first nanofluidic passages.

5. The nanofluidic structure of claim 2, wherein the bottom wall and the top wall of each of the second nanofluidic passages are positioned closer to each other than the bottom wall and the top wall of each of the first nanofluidic passages.

6. The nanofluidic structure of claim 3, further comprising a dielectric spacer in contact with side surfaces of the gate conductor.

7. The nanofluidic structure of claim 3, further comprising:

a first shallow trench isolation (STI) defined by the semiconductor substrate and filled by a dielectric material;

a second STI defined by the semiconductor substrate and filled by the dielectric material, the first STI spaced apart from the second STI;

wherein the bottom FET fins extend from the first STI to the second STI; and wherein the top FET fins extend from the first STI to the second STI.

8. The nanofluidic structure of claim 3, further comprising an electrode positioned in the second reservoir and electrically coupled to the gate conductor.

9. The nanofluidic structure of claim 3, further comprising an electrode positioned in the second reservoir and electrically coupled to one of the doped drain regions and the doped source regions.

10. The nanofluidic structure of claim 7, further comprising second nanofluidic passages extending from first STI to the second STI, each of the second nanofluidic passages includes a bottom wall, a top wall and sidewalls, the bottom wall defined by a respective one of the bottom FET fins, the top wall defined by a respective one of the top FET fins, and the sidewalls defined by the dielectric layer.

11. A method for constructing a nanofluidic structure comprising:

receiving a wafer having a semiconductor substrate, the wafer including a first set of vertical passage fins extending from the semiconductor substrate, each of the vertical passage fins including a bottom passage silicon fin in contact with the semiconductor substrate, a top passage silicon fin above and spaced apart from the bottom passage silicon fin, and a silicon-germanium passage fin positioned between and in contact with the bottom passage silicon fin and the top passage silicon fin, the silicon-germanium passage fin has a same crystal orientation as the bottom passage silicon fin;

encapsulating the vertical passage fins with an encapsulation layer;

etching the encapsulation layer and the semiconductor substrate to form a first reservoir proximate first ends of the vertical passage fins and a second reservoir proximate second ends of the vertical passage fins such that the first ends and the second ends of the vertical passage fins are exposed; and etching the silicon-germanium passage fins to form first nanofluidic passages between the first reservoir and the second reservoir.

12. The method of claim 11, further comprising:

growing an epitaxial silicon-germanium layer over the semiconductor substrate such that the silicon-germanium layer has a same crystal orientation as the semiconductor substrate;

depositing a silicon capping layer over the epitaxial silicon-germanium layer;

depositing a hardmask layer over the silicon capping layer;

forming one or more pillars over the hardmask layer;

forming sidewall spacers on opposite sides of the pillars;

removing the pillars while maintaining the sidewall spacers;

using the sidewall spacers as a mask to etch the first set of vertical passage fins extending from the semiconductor substrate below the sidewall spacers.

13. The method of claim 11, further comprising:

forming a second set of vertical passage fins extending from the semiconductor substrate spaced apart from the first set of vertical passage fins, each of the vertical passage fins of the second set of vertical passage fins including a bottom silicon passage fin in contact with the semiconductor substrate, a top silicon passage fin above and spaced apart from the bottom silicon passage fin, and a silicon-germanium passage fin positioned between and in contact with the bottom silicon passage fin and the top silicon passage fin, the silicon-germanium passage fin has the same crystal orientation as the bottom silicon passage fin;

etching the encapsulation layer and the semiconductor substrate to form a third reservoir proximate first ends of the vertical passage fins of the second set of vertical passage fins such that the second reservoir is proximate second ends of the vertical passage fins of the second set of vertical passage fins and the first ends and the second ends of the vertical passage fins of the second set of vertical passage fins are exposed; and etching the silicon-germanium passage fin of the second set of vertical passage fins to form second nanofluidic passages between the second reservoir and the third reservoir, each of the second nanofluidic passages has a smaller cross-sectional area than each of the first nanofluidic passages.

14. The method of claim 11, further comprising:

forming a set of vertical FET fins extending from the semiconductor substrate spaced apart from the first set of vertical passage fins, each of the vertical FET fins including a bottom silicon FET fin in contact with the semiconductor substrate, a top silicon FET fin above and spaced apart from the bottom silicon FET fin, and a silicon-germanium FET fin positioned between and in contact with the bottom silicon FET fin and the top silicon FET fin, the silicon-germanium FET fin has the same crystal orientation as the bottom silicon FET fin;

forming doped source regions on a first side of the vertical FET fins;

forming doped drain regions on a second side of the vertical FET fins, the second side of the vertical FET fins being opposite the first side of the vertical FET fins;

depositing a gate dielectric over and in contact with a top surface and the side surfaces of the top silicon FET fins, the gate dielectric positioned between the doped source regions and the doped drain regions;

depositing a gate conductor over and in contact with the gate dielectric;

etching the encapsulation layer and the semiconductor substrate to form a first well proximate first ends of the vertical FET fins such that the first ends of the vertical FET fins are exposed in the first well;

etching the encapsulation layer and the semiconductor substrate to form a second well proximate second ends of the vertical FET fins such that the second ends of the vertical FET fins are exposed in the second well;

etching the silicon-germanium FET fins to form FET passages between the first well and the second well; and depositing shallow trench insulator (STI) material in the first well and the second well.

15. The method of claim 13, wherein sidewalls of each of the second nanofluidic passages are positioned closer to each other than sidewalls of each of the first nanofluidic passages.

16. The method of claim 13, wherein a bottom wall and a top wall of each of the second nanofluidic passages are positioned closer to each other than a bottom wall and a top wall of each of the first nanofluidic passages.

17. The method of claim 14, wherein the bottom silicon FET fins extend from the STI material in the first well to the STI material in the second well.

18. The method of claim 14, further comprising depositing a dielectric spacer in contact with side surfaces of the gate conductor.

\* \* \* \* \*